United States Patent
Rischke et al.

(10) Patent No.: US 6,588,308 B2
(45) Date of Patent: *Jul. 8, 2003

(54) METHOD AND DEVICE FOR SEPARATING PRODUCTS, MOUNTED ON A COMMON SUBSTRATE, FROM EACH OTHER ALONG (A) CUTTING LINE(S)

(75) Inventors: Joerg W. Rischke, Veldhoven (NL); Hugo F. Menschaar, Knegsel (NL); Wilhelmus G. L. Van Sprang, Eindhoven (NL)

(73) Assignee: Meco Equipment Engineers B.V., Drunen (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/447,954

(22) Filed: Nov. 29, 1999

(65) Prior Publication Data

US 2001/0029820 A1 Oct. 18, 2001

(30) Foreign Application Priority Data

Jan. 19, 1999 (NL) .................................................. 1011077

(51) Int. Cl.[7] .................................................. B26D 7/08
(52) U.S. Cl. ............................... 83/16; 83/171; 83/169; 438/460
(58) Field of Search .................. 83/33, 34, 35, 83/36, 365, 368, 171, 16, 170, 169, 451; 451/450, 444; 438/113, 115, 460–465

(56) References Cited

U.S. PATENT DOCUMENTS

| | | | | |
|---|---|---|---|---|
| 2,191,916 A | * | 2/1940 | Schreiber | 29/148.4 |
| 3,407,690 A | * | 10/1968 | Stanley | 83/47 |
| 3,798,782 A | * | 3/1974 | Lindahl | 33/184.5 |
| 3,818,790 A | * | 6/1974 | Culp et al. | 83/408 |
| 4,054,070 A | * | 10/1977 | Steiling | 83/208 |
| 4,209,129 A | * | 6/1980 | Haas et al. | 234/108 |
| 4,484,417 A | * | 11/1984 | Klingerman | 51/267 |
| 4,578,203 A | * | 3/1986 | Franz et al. | 252/49.3 |
| 4,748,797 A | * | 6/1988 | Martin | 53/432 |
| 4,872,381 A | * | 10/1989 | Stroms | 83/76.1 |
| 4,920,947 A | * | 5/1990 | Scott et al. | 125/21 |
| 5,062,334 A | * | 11/1991 | Killilea et al. | 83/99 |
| 5,074,178 A | * | 12/1991 | Shetley et al. | 84/47 |
| 5,577,427 A | * | 11/1996 | Haar | 83/206 |
| 5,678,466 A | * | 10/1997 | Wahl | 83/168 |
| 5,790,402 A | * | 8/1998 | Liebermann et al. | 83/365 |
| 5,839,337 A | * | 11/1998 | Neu | 83/255 |
| 5,972,154 A | * | 10/1999 | Konya | 156/268 |

FOREIGN PATENT DOCUMENTS

| | | |
|---|---|---|
| JP | 62-249446 | 10/1987 |
| JP | 01-188308 | 7/1989 |
| JP | 02-102559 | 4/1990 |
| JP | 03-048443 | 3/1991 |
| JP | 04-035846 | 2/1992 |
| JP | 6-275712 | 9/1994 |

* cited by examiner

Primary Examiner—Kenneth E. Peterson
Assistant Examiner—Omar Flores-Sánchez
(74) Attorney, Agent, or Firm—Oblon, Spivak, McClelland, Maier & Neustadt, P.C.

(57) ABSTRACT

The invention relates to a method and a device for separating products mounted on a common substrate, from each other, along (a) cutting line(s). The products each comprise one or more chips present on said substrate and connecting means connected thereto, the connecting ends remote from the chip of which are provided with solder balls bonded thereto. The products are clamped down on a supporting element by using a sub-atmospheric pressure, and the supporting element and a rotary cutting blade are moved relative to each other along the intended cutting line so as to cut through the substrate. A liquid is supplied at the location of said cutting line on either side of the substrate.

8 Claims, 2 Drawing Sheets

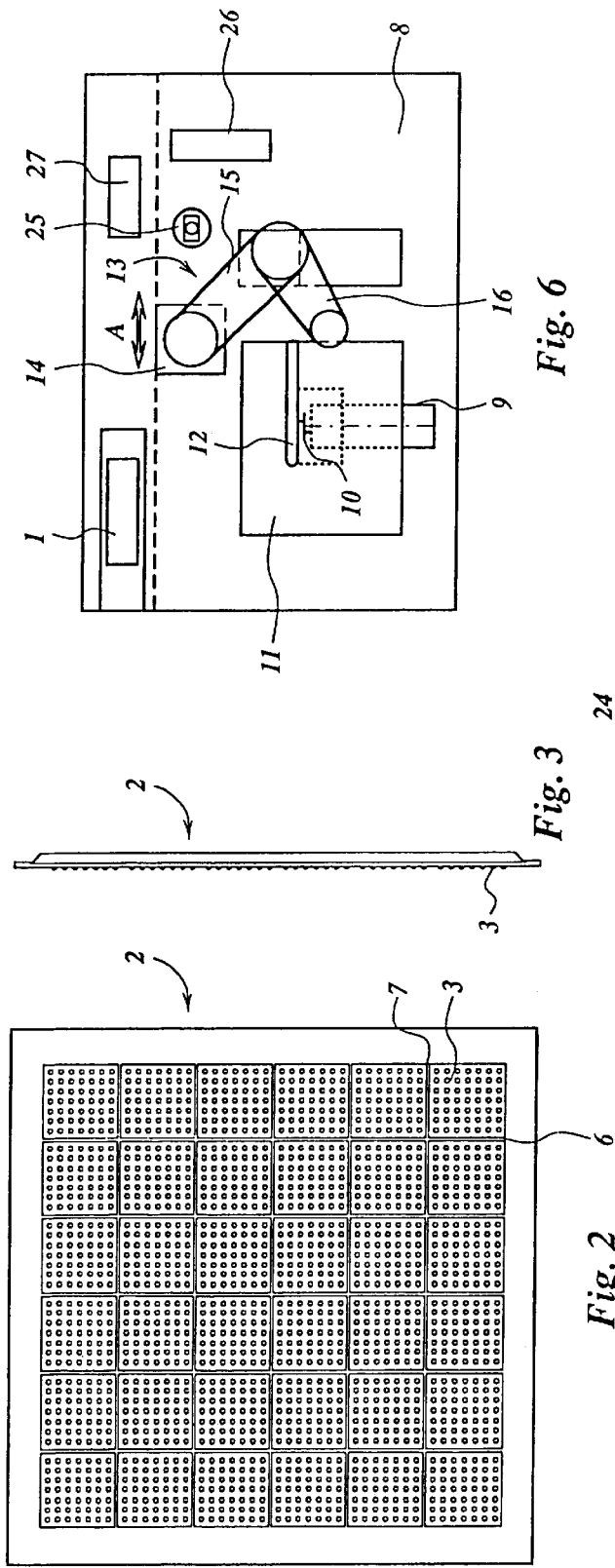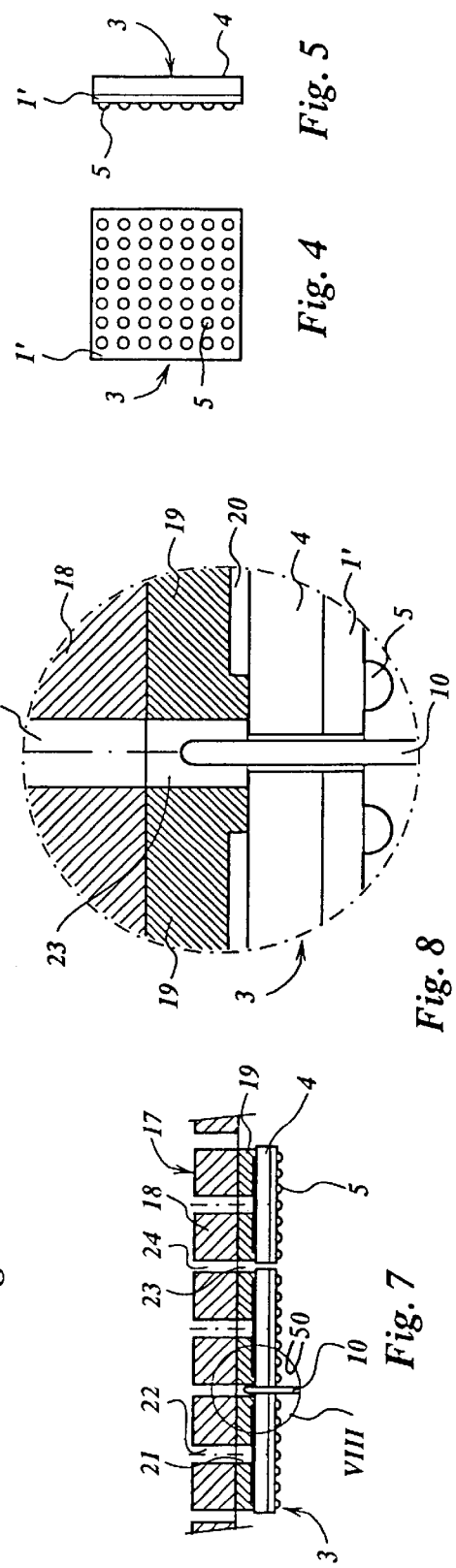

METHOD AND DEVICE FOR SEPARATING PRODUCTS, MOUNTED ON A COMMON SUBSTRATE, FROM EACH OTHER ALONG (A) CUTTING LINE(S)

BACKGROUND OF THE INVENTION

The invention relates to a method for separating products mounted on a common substrate from each other along (a) cutting line(s), which products each comprise one or more chips present on said substrate and connecting means connected thereto, the connecting ends remote from the chip of which are intended for connecting purposes.

A method for manufacturing such products is for example disclosed in European patent application EP-A-0 885 683. A large number of chips and associated connecting means, such as connection wires and solder balls which may be bonded to the connecting ends, are thereby present on a substrate. The products, which each comprise one or more chips and connection wires or the like connected thereto as well as solder balls which may be bonded to the connecting ends of said wires, must be separated from each other. In the case of larger products, the associated chip(s) may each be separately encapsulated, whilst in the case of smaller products a large number of chips associated with several products may be jointly encapsulated.

The substrate and, if present, possibly also the layer of material encapsulating the chips must be cut or sawn through for separating the products from each other.

With conventional methods, the joined products are mounted to a substrate and subsequently said substrate and possibly the layer of material encapsulating the chips are cut through. One drawback of the method that has been used so far is the fact that it is difficult to cool the saw blade or the like, since access to the saw blade is only possible from one side of the products. Another drawback is the fact that contamination with saw-dust of the products occurs, which makes it necessary to subject the products to a time-consuming and expensive cleaning treatment after they have been separated from each other.

SUMMARY OF THE INVENTION

According to the invention, the products are clamped down on a supporting element by using a vacume, and said supporting element and a rotating cutting blade are moved relative to each other along the intended cutting line so as to cut through the substrate, whilst a liquid is being supplied at the cutting line on either side of the substrate.

By using the method according to the invention, an effective cooling of the cutting blade on either side of the substrate can be effected, which has a positive influence on the working life of the cutting blade. In addition, the supply of a sufficient amount of liquid makes it possible for saving dust and any other fouling material to be washed off while the products are being separated from each other, so that it will not be necessary to clean the products after they have been separated from each other.

A method for clamping down products on a supporting element by using a sub-atmospheric pressure with a view to cutting the substrate through so as to separate the products from each other is known per se. The connecting ends face towards the substrate thereby. The construction must be such that each product to be cut out is supported all around by an edge portion which is present between the cut to be formed and the connecting ends.

According to another aspect of the invention, the products are clamped down on the supporting element on the side of the products remote from the connecting ends, so that the connecting ends can remain in sight, whilst the products can be clamped down on the at least substantially flat surface of the chip-loaded substrate. An advantage of this is the fact that it is possible to move the cutting blade closely past the connecting ends of a product, as a result of which the spacing between the products can be reduced.

A simple and efficient device for carrying out the above method is obtained when the device comprises a cutting blade to be rotated about an axis of rotation and a supporting element which is provided with spaced-apart suction cups and lines connected thereto for generating a sub-atmospheric pressure on the side of the suction cups remote from said supporting element and with lines for supplying a liquid between said suction cups.

Preferably, said supporting element is thereby fixed to a manipulator, by means of which said supporting element can be moved in desired directions relative to the cutting blade.

The invention will be explained in more detail hereafter with reference to the accompanying figures.

BRIEF DESCRIPTION OF THE DRAWINGS

FIG. 2 is a plan view of a separate field of thirty-six products to be separated from each other.

FIG. 3 is a side view of FIG. 2.

FIG. 4 is a larger-scale view of a single product.

FIG. 5 is a side view of FIG. 4.

FIG. 6 is a schematic plan view of an embodiment of a device according to the invention.

FIG. 7 is a larger-scale sectional view of a part of a carrier with a few products attached thereto.

FIG. 8 is a larger-scale view of the encircled portion VIII in FIG. 7.

DETAILED DESCRIPTION OF THE PREFERRED EMBODIMENT

Figure 1:
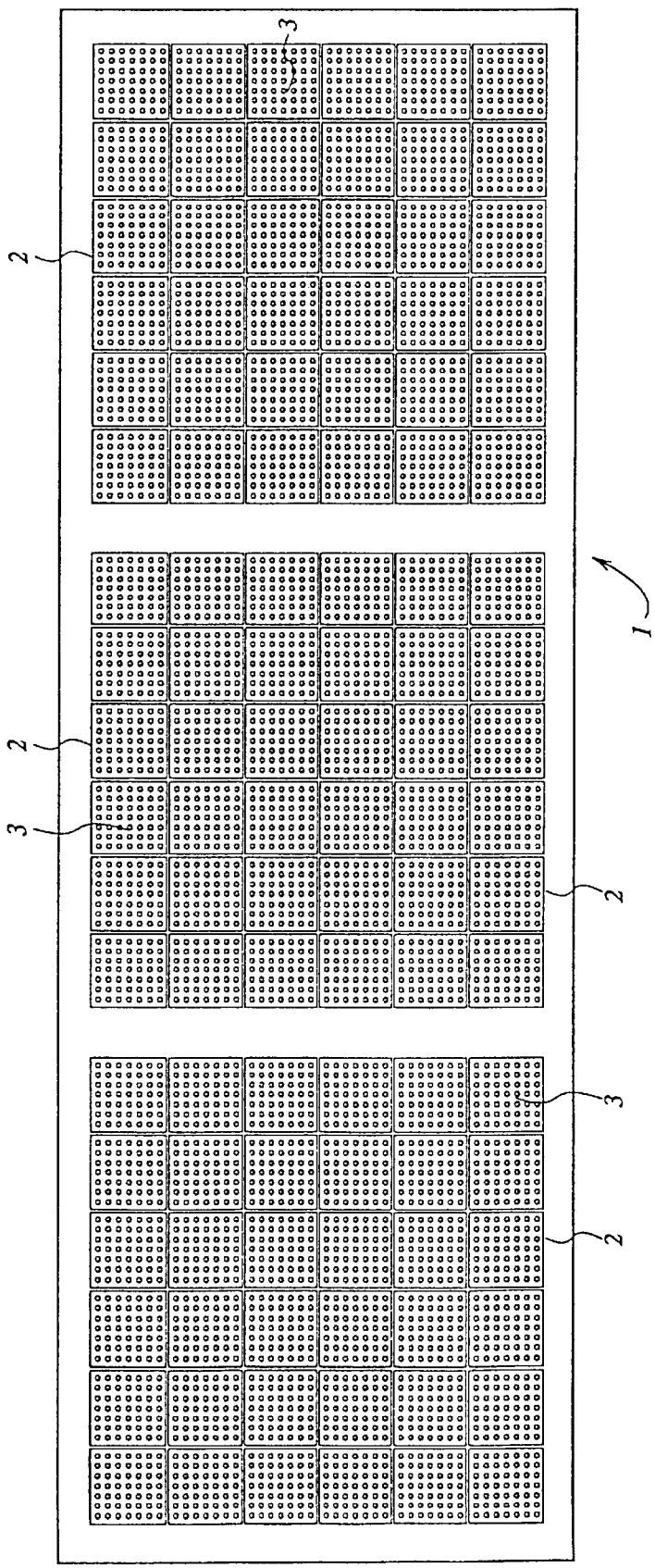
FIG. 1 is a plan view of a possible embodiment of a substrate on which three product fields are present, each field comprising thirty-six products in the illustrated embodiment.

FIG. 1 shows a substrate 1 on which three fields 2 of products 3 arranged in rows and columns, thirty-six products 3 per field 2 in the illustrated embodiment, are present.

As is shown in FIGS. 4 and 5, each product within the scope of the present application comprises a substrate portion 1', on one side of which a coating 4 is present, in which one or more chips (not shown) is (are) encapsulated. Connected to said chip(s) are connecting means, to the connecting ends of which remote from said coating 4 solder balls 5 are bonded in certain cases. As those skilled in the art will know, however, also other embodiments of such products comprising one or more chips are conceivable.

A product assembly as shown in FIG. 1 may for example be manufactured in a device as disclosed in the aforesaid European patent application No. 0 885 683. Of course also other devices for manufacturing such products are conceivable, however, whilst also the shapes and the numbers of initially joined fields and products may differ from those which are shown in FIGS. 1 and 2.

In order to separate the products 3 from each other, the substrate 1 comprising three fields which is shown by way of example in FIG. 1 will preferably be cut or sawn into three parts so as to obtain separate fields 2 as shown in FIGS. 2 and 3. Then, in order to obtain the separate products 3, the fields 2 will be cut or sawn through according to cutting lines 6 and 7 intersecting each other perpendicularly in the illustrated embodiment (FIG. 2), which are located in the spaces between products 3 in the aforesaid columns and rows of products 3.

A device as schematically indicated in FIG. 6 may be used for separating the joined products, Said device comprises a frame 8, in which a motor 9 is mounted, by means of which a cutting disc 10 which is rotatable about a horizontal axis of rotation can be driven. Cutting disc 10 is covered by means of a cover 11, preferably of a transparent material, which is movably supported on frame 8 in a direction parallel to the axis of rotation of cutting disc 10. A slotted hole 12, which is open at one end thereof, is provided in cover 11, which slotted hole extends perpendicularly to the axis of rotation of cutting disc 10.

The device further comprises a manipulator 13, which is provided with a support 14 fixed to frame 8. Support 14 supports a first arm 15, which is capable of pivoting movement about a vertical axis with respect to support 14.

Mounted on the end of first arm 15 remote from support 14 is a second arm 16, which is capable of pivoting movement about a vertical axis with respect to first arm 15.

Mounted on the free end of arm 16 is a shaft (not shown) extending downwards from arm 16, which is rotatable about a vertical axis of rotation, to the lower end of which a supporting element 17 for picking up an assembly of products can be detachably attached. Said supporting element can also be reciprocated in vertical direction with respect to arm 16. Also other embodiments of a manipulator by means of which the supporting element 17 can be moved as desired are conceivable, of course.

FIGS. 7 and 8 show a part of a possible embodiment of such a supporting element 17 for picking up the field 2 of products 3 as shown in FIG. 2.

Such a supporting element 17 comprises a supporting plate 18, on which a number of suction cups 19 are mounted in a pattern which corresponds to the pattern of the products 3 in the field to be picked up. As will be apparent from FIGS. 7 and 8, the cross-sectional area of suction cups 19 is slightly smaller than that of products 3. A recess 20 is formed in each suction cup on the side of the suction cups remote from supporting plate 18, so that the suction cups only come into contact with the flat side of coating 4 remote from the solder balls 5 along their closed outer circumference. Each recess 20 is in communication with a bore 22 provided in supporting plate 18 via a bore 21 provided in suction cup 19. The bores 22 provided in supporting element 17 are in communication, in a manner which is not shown, to a device for generating a sub-atmospheric pressure.

It will be apparent that grooves 23 are present between the suction cups 19 on supporting plate 18 in a pattern which corresponds to the pattern of the cutting lines 6, 7 or of the spaces present between the products 3 in a field 2. Bores 24 formed in supporting plate 18 open into said grooves. Said bores 24 are in communication, in a manner which is not shown, to a source for supplying a cooling liquid, such as water.

A supporting element 17 can be used for picking up the substrate comprising three fields as shown in FIG. 1, which supporting element is provided with a supporting plate 18 comprising three suction cups 19 mounted thereon, wherein the size of each suction cup 19 is adapted to conform to the size of a field 2, and wherein slots 23, which are also in communication with liquid supply channels, will be present between said suction cups 19.

The device further comprises a camera 25, which is connected to a computer (not shown), by means of which the device, in particular manipulator 13, is controlled.

A test piece is picked up by means of a supporting element and a saw cut is made in said test piece for the purpose of inputting the correct position of the cutting blade 10 with respect to manipulator 13 into the computer. Then the object in which a saw cut has thus been made is positioned in front of camera 25, and data relating to the position of the saw blade relative to supporting element 17 are fed into the computer on the basis of the position and the length of the saw cut as detected by the camera.

Then one or more substrates 1 with products 3, for example as shown in FIG. 1, can be supplied to the device 8, as is indicated in the left-hand top corner of FIG. 6. Said substrates can be picked up one by one by means of the manipulator and be moved past the cutting blade 10 so as to separate fields 2 from each other. Substrate 1 is first positioned in front of camera 25 by means of manipulator 13 for the purpose of determining the position of fields 2 and in particular the position of the connecting ends, the solder balls or the like relative to supporting element 17, in such a manner that supporting element 17 will be so controlled that substrate 1 will be cut through correctly between fields 2. The manipulator shaft, to which supporting element 17 is attached, will be led through slot 12 in cover 11 during the cutting operation, and since cover 11 is movable in a direction parallel to the axis of rotation of cutting disc 10, cover 11 can be moved by manipulator 13 in order to move the substrate to be cut through, on which products are present, to the correct position relative to cutting blade 10.

During the cutting operation, cutting blade 10 will penetrate through the substrate 1 to be cut, and possibly through coating 4, into the slot 23 present between suction cups 19. The cutting blade will thereby be cooled during said cutting by means of a cooling liquid which is supplied via bores 24, as well as by a cooling liquid which is sprayed against the cutting blade under the object to be cut through, that is, on the side of solder balls 5, by means of spraying elements 50 or the like during cutting.

By using a sufficient amount of cooling liquid, the cutting dust or chips being released when the objects are being cut will be washed away by the liquid flows, so that clean products will be obtained. By positioning the cutting blade under the products being cut by the cutting blade, the waste that is produced can easily fall down and be discharged.

The separated fields 2 can be placed at a depositing station 26. When a plurality of separated fields 2 have been obtained in this manner, the supporting element coupled to the manipulator for picking up the objects shown in FIG. 1 can be exchanged for a supporting element 17 which is suitable for picking up a field as shown in FIG. 2, wherein each product 3 is held by its own suction cup 19. Following the determination of the position by means of camera 25 and the movement of supporting element 17 derived therefrom, the products present in such a field can be separated from each other, for example by cutting through said field according to cutting lines 6 first, after which the field can be cut through according to cutting lines 7 once the supporting element 17 supporting the products has been rotated through 90°. Also in this case, water or a similar cooling liquid will be supplied to a sufficient degree during cutting, of course, for cooling the cutting blade and washing away the dust and the like that is being released during cutting.

After the products 3 have thus been separated from each other, they may be led, still connected to supporting element 17, past blowing nozzles (not shown), via which air, which may or may not be heated, is blown past the products so as to remove adherent water. Then the products can be deposited at a depositing station 27, for example, from where they can be supplied to further processing devices or the like.

Of course it is also conceivable not to separate fields 2 from each other before the products 3 are separated from each other, but rather separate the products 3 present in a number of joined fields 2 directly from each other.

What is claimed is:

1. A method for separating products formed on a common substrate, said products each having one or more chips and connecting means connected to said one or more chips, said connecting means having connecting ends at one side of the products and remote from the chip, the method comprising:

providing a rotating cutter positioned below the common substrate and a supporting element positioned above the common substrate, the supporting element having vacuuming means for holding the products such that gaps are formed between each of the products and a plurality of ducts positioned to supply liquid to the gaps from a side of the supporting element opposing a side of the rotating cutter;

holding the products with the vacuum means of the supporting element such that the gaps are formed between each of the products;

moving the supporting element and the rotating cutter relatively to each other along the gaps; and supplying liquid during a cutting operation to said gaps via the ducts from the side of the supporting element opposing the side of the rotating cutter and to the rotating cutter below the common substrate.

2. A method for separating products formed on a common substrate, said products each having one or more chips and connecting means connected to said one or more chips, said connecting means having connecting ends at one side of the products and remote from the chips, the method comprising:

providing a rotating cutter positioned below the common substrate and a supporting element positioned above the common substrate, the supporting element having a plurality of holding devices configured to hold the products such that gaps are formed between each of the products and a plurality of ducts positioned to supply liquid to the gaps from a side of the supporting element opposing a side of the rotating cutter;

holding each of the products with a respective one of the plurality of holding devices of the supporting element such that the gaps are formed between each of the products;

moving the supporting element and the rotating cutter relatively to each other along the gaps; and supplying liquid from the side of the supporting element opposing the side of the rotating cutter during a cutting operation to said gaps via said ducts provided in the supporting element and to the rotating cutter below the common substrate.

3. A method according to claim 2, wherein said plurality of holding devices each comprises a vacuum suction.

4. A device for separating products formed on a common substrate, the products each having one or more chips and connecting means connected to said chips, said connecting means having connecting ends at one side of the products and remote from the chips, the device comprising:

a supporting element positioned above the common substrate and having a plurality of suction cups positioned to hold the products such that gaps are formed between each of the products and a plurality of apertures positioned to supply liquid to the gaps;

a cutter positioned to cut the common substrate from underneath along the gaps; and at least one spraying element positioned to spray liquid to the cutter below the common substrate, wherein the plurality of a apertures supplies the liquid from a side of the supporting element opposing a side of the rotating cutter.

5. A device according claim 4, further comprising:

a manipulator configured to move the supporting element with respect to the cutting blade.

6. A device according to claim 4, further comprising:

a camera configured to detect a position of a product clamped down on the supporting element; and a computer configured to control said manipulator and receive signals from said camera.

7. A device according to claim 4, further comprising:

means for blowing moisture from the products and drying said products.

8. A device according claim 4, wherein said cutting blade is disposed substantially under a path of movement of the supporting element to be moved by said manipulator.

* * * * *